(12) United States Patent
Venkata et al.

(10) Patent No.: US 11,075,178 B2
(45) Date of Patent: Jul. 27, 2021

(54) RF POWER AMPLIFIER PALLET

(71) Applicant: Ampleon Netherlands B.V., Nijmegen (NL)

(72) Inventors: Gutta Venkata, Nijmegen (NL); Iouri Volokhine, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 16/685,032

(22) Filed: Nov. 15, 2019

(65) Prior Publication Data

US 2020/0168571 A1 May 28, 2020

(30) Foreign Application Priority Data

Nov. 23, 2018 (NL) ...................................... 2022062

(51) Int. Cl.
*H03F 3/14* (2006.01)
*H01L 23/66* (2006.01)
(Continued)

(52) U.S. Cl.
CPC .............. *H01L 23/66* (2013.01); *H01L 23/13* (2013.01); *H01L 23/49822* (2013.01);
(Continued)

(58) Field of Classification Search
CPC ... H01L 23/66; H01L 23/13; H01L 23/49822; H01L 23/49833; H01L 23/49838; H01L 24/05; H01L 24/48; H01L 24/49; H01L 2223/6611; H01L 2223/6616; H01L 2223/6633; H01L 2223/6655;
(Continued)

(56) References Cited

U.S. PATENT DOCUMENTS

2001/0048164 A1* 12/2001 Tateoka .................. H01L 23/66
257/758
2003/0100197 A1 5/2003 Veitschegger et al.
(Continued)

OTHER PUBLICATIONS

NL Search Report, NL Application No. NL2022062, dated Jul. 8, 2019, 9 pages.
(Continued)

*Primary Examiner* — Khanh V Nguyen
(74) *Attorney, Agent, or Firm* — McDonnell Boehnen Hulbert & Berghoff LLP

(57) ABSTRACT

An example embodiment relates to a radiofrequency (RF) power amplifier pallet, and further relates to an electronic device that includes such a pallet. The RF power amplifier pallet may include a coupled line coupler that includes a first line segment and a second line segment that is electromagnetically coupled to the first line segment. A first end of the first line segment may be electrically connected to an output of an RF amplifying unit. The RF power amplifier pallet may further include a dielectric filled waveguide having an end section of the first dielectric substrate, an end section of the second dielectric substrate, and a plurality of metal wall segments covering the end sections of the first and second dielectric layers. The plurality of metal wall segments may be arranged spaced apart from the first line segment and electrically connected to a first end of the second line segment.

18 Claims, 7 Drawing Sheets

(51) Int. Cl.
*H01L 23/13* (2006.01)
*H01L 23/498* (2006.01)
*H01L 23/00* (2006.01)
*H01P 3/16* (2006.01)
*H01P 5/08* (2006.01)
*H03F 1/56* (2006.01)
*H03F 3/21* (2006.01)
*H05B 6/48* (2006.01)
*H04B 1/04* (2006.01)

(52) U.S. Cl.
CPC .. *H01L 23/49833* (2013.01); *H01L 23/49838* (2013.01); *H01L 24/05* (2013.01); *H01P 3/16* (2013.01); *H01P 5/087* (2013.01); *H03F 1/56* (2013.01); *H03F 3/21* (2013.01); *H05B 6/48* (2013.01); *H01L 24/48* (2013.01); *H01L 24/49* (2013.01); *H01L 2223/6611* (2013.01); *H01L 2223/6616* (2013.01); *H01L 2223/6633* (2013.01); *H01L 2223/6655* (2013.01); *H01L 2224/04042* (2013.01); *H01L 2224/48106* (2013.01); *H01L 2224/48227* (2013.01); *H01L 2224/49176* (2013.01); *H01L 2924/1033* (2013.01); *H01L 2924/10253* (2013.01); *H01L 2924/1306* (2013.01); *H01L 2924/13091* (2013.01); *H01L 2924/1903* (2013.01); *H01L 2924/19032* (2013.01); *H01L 2924/30111* (2013.01); *H03F 2200/222* (2013.01); *H03F 2200/387* (2013.01); *H03F 2200/423* (2013.01); *H03F 2200/451* (2013.01); *H04B 1/04* (2013.01)

(58) Field of Classification Search
CPC . H01L 2224/04042; H01L 2224/48106; H01L 2224/48227; H01L 2224/49176; H01L 2924/10253; H01L 2924/1033; H01L 2924/1306; H01L 2924/13091; H01L 2924/1903; H01L 2924/19032; H01L 2924/30111; H01L 23/49827; H01L 23/3677; H01L 2223/6627; H01P 3/16; H01P 5/087; H03F 1/56; H03F 3/21; H03F 2200/222; H03F 2200/387; H03F 2200/423; H03F 2200/451; H03F 2200/204; H03F 3/24; H03F 3/60; H03F 3/189; H03F 3/245; H03F 3/195; H03F 1/0205; H05B 6/48; H05B 6/707; H05B 6/686; H04B 1/04
See application file for complete search history.

(56) References Cited

U.S. PATENT DOCUMENTS

2015/0303881 A1    10/2015   Blednov et al.
2020/0067198 A1*   2/2020    Hunziker ............... H01L 24/20

OTHER PUBLICATIONS

Jensen, Thomas et al., "Coupled Transmission Lines as Impedance Transformer", IEEE Transactions on Microwave Theory and Techniques, vol. 55, No. 12, Dec. 2007, 10 pages.

* cited by examiner

RF POWER AMPLIFIER PALLET

CROSS REFERENCE TO RELATED APPLICATIONS

The present application claims priority to Netherlands Patent Application NL2022062, which was filed in the Netherlands Patent Office on Nov. 23, 2018, and which is hereby incorporated in its entirety herein by reference.

FIELD OF INVENTION

The present invention relates to a radiofrequency 'RF' power amplifier pallet. The present invention further relates to an electronic device comprising such a pallet.

BACKGROUND

Today, the application area of RF power amplifiers is diverse. For example, RF power amplifiers can be found in mobile telecommunications base stations, in RADAR applications, and in solid state cooking devices. These amplifiers are offered in various forms. For example, an RF power amplifier can be in the form of a semiconductor die. In such case, the party or parties acquiring the semiconductor dies(s) need(s) to design and implement many additional features before the final product is obtained. Examples of such features are impedance matching, power combining, power splitting, and mounting the semiconductor die in a package.

A higher level of integration is offered by RF power packages in which one or more semiconductor dies are mounted. If needed, some of the impedance matching can be arranged in the package itself, thereby reducing the burden for the customer.

An even higher level integration is offered by RF power modules. These modules not only comprise the RF power amplifier, either in the form of one or more mounted semiconductor dies or in the form of one or more RF power packages, but also provide other circuitry such as a large part of the impedance matching and signal combining/splitting. Typically, an RF power module comprises a printed circuit board (PCB) on which the various functions are realized. Furthermore, the RF power module may comprise a casing, such as a metal enclosure. The RF power module may comprise one or more semiconductor dies or RF power packages.

Another level of integration is offered by an RF power amplifier pallet. A known example thereof is illustrated in FIG. 1A, which presents a cross-sectional view, and in FIG. 1B, which presents a top view. This known RF power amplifier pallet 100 comprises a first dielectric substrate 101 and a second dielectric substrate 102, arranged on first dielectric substrate 101. Second dielectric substrate 102 is typically a multilayer substrate and may comprise a first dielectric layer 102a and a second dielectric layer 102b. Also first dielectric substrate 101 may be in the form of a multilayer substrate.

First and second dielectric substrates 101, 102, may be provided with metal layers for realizing electric circuitry. For example, second dielectric substrate 102 may be provided with a first metal layer 103a arranged on a top surface of first dielectric layer 102a, with a second metal layer (not shown) in between first and second dielectric layers 102a, 102b, and with a third metal layer 103c on the bottom surface of second dielectric layer 102b. Similarly, first dielectric substrate 101 may be provided with a metal layer 104a on a top surface thereof. This metal layer may contact third metal layer 103c and may be fixedly connected thereto or these layers are integrally formed. Furthermore, first dielectric substrate 101 may be provided with a metal layer 104b on a bottom side thereof.

Second dielectric substrate 102 comprises a cavity 105 in which an RF amplifying unit in the form of a semiconductor die 107 is arranged. On semiconductor die 107, a RF power transistor 120 is arranged which has an input terminal, e.g. a gate, and an output terminal, e.g. a drain. An input and an output of the RF amplifying unit are also formed on semiconductor die 107, for example in the form of bondpads 121. These bondpads can be connected directly to the input or output terminal of RF power transistor 120 or can be integrally formed therewith. Alternatively, additional circuitry, such as impedance matching networks, may be arranged in between the input terminal or output terminal and the input or output of amplifying unit, respectively. In addition, bondwires 108 connect bondpads 121 of the input of the RF amplifying unit to a bonding area 111 formed using first metal layer 103a, see FIG. 1B. A similar connection is made between a bonding area 111 at the output and bondpads 121 of the output of the RF amplifying unit.

As can be seen in FIG. 1A, pallet amplifier 100 comprises a coin 106 that is arranged in a cavity within first dielectric substrate 101. This coin is usually made of copper and provides a much higher thermal conductivity than the remainder of first dielectric substrate 101.

Coin 106 cannot be made arbitrarily thin. This means that first dielectric substrate 101 requires a certain thickness. On the other hand, most RF sensitive components are realized in second dielectric substrate 102. For example, microstrip lines are formed using a line segment 110 in first metal layer 103a and a ground plane in the second metal layer or in third metal layer 103c, see FIG. 1B. First dielectric substrate 101 is therefore mostly fabricated using relatively low-cost materials, whereas second dielectric substrate 102 is fabricated using relatively high-cost materials as the RF losses associated with this substrate should be minimized.

Typically, on the back side of first dielectric substrate 101 a further ground plane is realized using metal layer 104b. When the pallet is mounted in a larger system, this further ground plane is connected to the global ground of the larger system. In addition, the further ground plane electrically connects to coin 106. To connect the ground plane associated with the microstrip lines, which is for example realized in third metal layer 103c, to the further ground plane realized in metal layer 104b, one or more vias 109 are used.

FIGS. 2A and 2B illustrate a cross-sectional view and a top view, respectively, of another known RF power amplifier pallet 200, wherein the same reference signs are used to indicate identical or similar components. Compared to pallet 100 shown in FIG. 1A, pallet 200 comprises an RF power amplifier package 117 having an input in the form of an input lead 118a and an output in the form of an output lead 118b. These leads are connected, either directly or indirectly via matching networks, to the input and output terminals of a RF power transistor, respectively, that is arranged inside RF power amplifier package 117. Furthermore, input and output leads 118a, 118b, are received on lead receiving pads 119a, 119b, respectively, which are realized in first metal layer 103a. It should be noted that in FIG. 2B RF power amplifier package 117 is shown in a partially opened configuration, in which it is visible that leads 118a, 118b extend partially inside the housing of package 117 to allow a connection with bondwires as will be discussed next.

RF power amplifier package 117 may for example comprise a package substrate in the form of a metal flange (not shown) on which a semiconductor die, such as die 107 in FIG. 1B or the like, is arranged in which a RF power transistor, such as RF power transistor 120, is realized. Similar to the embodiment in FIG. 1A, the RF power transistor is connected to input and output bondpads 121 arranged on semiconductor die 107. Connections between input lead 118a and input bondpad 121, and between output lead 118b and output bondpad 121, are formed using one or more bondwires 122.

Although FIG. 2B illustrates a direct connection between leads 118a, 118b and bondpads 121 alternative configurations are possible. For example, additional circuitry can be arranged in between leads 118a, 118b and corresponding bondpads 121. For example, matching networks could be arranged in between a lead and a bondpad. Such matching network could comprise a capacitor mounted with one terminal to the flange and the other terminal to one or more bondwires extending from the capacitor towards the lead and to one or more bondwires extending towards the respective bondpad.

RF power amplifier package 117 may further comprise a lid or the package may be enclosed or sealed using a solidified molding compound. Furthermore, in pallet 200, vias 109 are used in a similar manner as vias 109 in FIG. 1A.

Abovementioned vias 109 play an important role for the power capability of the pallet. These vias may for example carry the return current that is associated with the current through a microstrip line 110, as shown in FIGS. 1B and 2B. The Applicant has found that when higher powers are required, a problem may occur in that vias 109 are not able to withstand the high return currents and/or that the self-inductance of vias 109 becomes increasingly important. Here, it is noted that if multiple vias are used, only those vias that are arranged close to line segment 110 will carry a significant amount of current. Therefore, electrical parameters such as the effective self-inductance and power carrying capability of the plurality of vias do not scale linearly with the number of vias. This particularly becomes a problem at higher powers, where impedance levels become relatively small.

A known approach to mitigate the problems associated with vias at higher powers is to increase the size of coin 106 such that it completely extends underneath microstrip line 110. Here, coin 106 contacts the ground plane of the microstrip line realized in third metal layer 103c. Being conductive, coin 106 provides a low loss and low inductance connection to the further ground plane.

A drawback of the known approach described above is related to costs. Coin 106 comprises a considerable amount of relatively expensive material. From a costs perspective, increasing the coin size is therefore not desired.

An RF power amplifier pallet as defined by the preamble of claim 1 is known from US 2003/100197 A1. A further RF amplifier pallet is known from US 2015/303881 A1.

SUMMARY

It is therefore an object of the present invention to provide a solution to the abovementioned problem wherein the power to be delivered by the pallet can be increased without the need for increasing the coin size, or at least to a lesser extent.

This object has been achieved using the RF power amplifier pallet as defined in claim 1 which is characterized in that the RF power amplifier pallet further comprises a coupled line coupler comprising a first line segment and a second line segment that is electromagnetically coupled to the first line segment, wherein a first end of the first line segment is electrically connected to the output of the RF amplifying unit.

The RF power amplifier pallet is further characterized in that it comprises a dielectric filled waveguide, typically having a rectangular configuration, comprising an end section of the first dielectric substrate, an end section of the second dielectric substrate, and a plurality of electrically connected metal wall segments covering the end sections of the first and second dielectric layers, wherein the plurality of wall segments is arranged spaced apart from the first line segment and is electrically connected to a first end of the second line segment.

The RF power amplifier pallet according to the invention does not suffer from the scaling problem of the vias as discussed in connection with the prior art pallets of FIGS. 1A and 2A. Power scaling of these pallets can therefore be implemented more easily without the need for introducing special measures to address the self-inductance problem of the vias.

The manner in which electromagnetic energy is transported in the waveguide deviates from the manner in which electromagnetic energy is transported in a microstrip or bondwire. More in particular, when using the dielectric filled waveguide the abovementioned problems associated with vias do not occur or at least to a lesser extent. Additionally, the Applicant has found that overheating issues sometimes found in prior art devices do not occur or at least to a lesser extent.

An additional effect of using the dielectric filled waveguide is that it provides shielding of the RF amplifying unit against electromagnetic radiation from other parts of the system. In such a manner, electromagnetic coupling between parts of the output of the system and sensitive parts at the input of the system, e.g. the input of the RF amplifying unit, can be mitigated.

The plurality of wall segments may comprise an upper wall segment covering a top surface of the first dielectric layer and a lower wall segment covering a bottom surface of the first dielectric substrate. Moreover, the RF power amplifier pallet may further comprise a first plurality of vias that connect the upper wall segment to the lower wall segment and/or one or more side wall segments that cover a side surface of the first and second dielectric substrate and that electrically connect the upper and lower wall segments.

A second end of the first line segment and a second end of the second line segment may be connected to an electrical open. More in particular, these ends may not be connected to any further components such that these ends can be regarded as being connected to an electrical open, or at least to a very high impedance at the frequency of interest.

The coupler is preferably configured to convert a low output impedance at the output of the amplifying unit to a higher impedance. In this manner, the coupler has a dual function. As mentioned above, the manner in which electromagnetic energy is transported by the dielectric filled waveguide is different from the manner in which energy is transmitted by a microstrip or bondwire. A first function of the coupler is therefore to bridge between these two different ways of transporting energy. A second function of the coupler is related to the up-conversion of impedance levels. For example, the output impedance of the RF amplifying unit may be 2 Ohm or less, whereas the target input impedance of the waveguide can be designed at 40-60 Ohm.

An electrical length between the output terminal of the RF power transistor, the output of the RF amplifying unit, or the end of the first line segment that is connected to the output of the RF amplifying unit, and an opposing end of the first line segment may substantially equal (2n+1) times 90 degrees, wherein n is an integer number equal to 0 or larger 4. For example, the line lengths used for the first and second line segments can be approximately 90 degrees at a frequency of interest. However, small deviations can be made relative to this quarter wavelength configuration to account for electrical delay between the output of the RF power transistor and the first end of the first line segment and/or parasitic elements at the begin or end of the first or second line segment.

The first line segment can be arranged on one of the first dielectric layer and the second dielectric layer, and the second line segment can be arranged on the other of the first dielectric layer and the second dielectric layer. This configuration provides an attractive solution in terms of compactness and manufacturability. However, the present invention does not exclude other types of coupled line couplers, such as broadside coupled lines, edge coupled lines, Lange couplers, and the like.

The RF power amplifier pallet may further comprise a source pad and a load pad arranged on the first dielectric layer or the second dielectric layer, wherein the source pad is electrically connected to the input of the RF amplifying unit and wherein the load pad is electrically connected to the output of the RF amplifying unit and to the first line segment.

The source and load pads may be arranged on the second dielectric layer and the second dielectric substrate may comprise a recess of the first dielectric layer near the cavity thereby exposing the source and load pads. In this manner, a cavity having a stepped wall is formed. Alternatively, the source and load pads are arranged on the first dielectric layer.44

The RF amplifying unit may comprise an RF power amplifier package in which the RF power transistor is accommodated. The package may comprise an input lead forming the input of the RF amplifying unit and being connected to an input terminal of the RF power transistor, e.g. a gate. The package may further comprise an output lead forming the output of the RF amplifying unit and being connected to an output terminal of the RF power transistor, e.g. a drain. The input lead and output lead may be physically connected, for example by soldering, to the source pad and load pad, respectively.

Alternatively, the RF amplifying unit may comprise a semiconductor die on which the RF power transistor is arranged. The semiconductor die may comprise an input bond pad or bar forming the input of the amplifying unit and being connected to an input terminal of the RF power transistor. Furthermore, the semiconductor die may comprise an output bond pad or bar forming the output of the RF amplifying unit and being connected to an output terminal of the RF power transistor. The input and output bond pads or bars may be electrically connected, for example by bondwires, to the source pad and load pad, respectively.

The connection between the input terminal of the RF power transistor and the input of the RF amplifying unit may be a direct connection in the sense that no other electrical components are arranged in between the input terminal and the input other than some electrical length to make the connection. Similar considerations hold for the output terminal of the RF power transistor and the output of the RF amplifying unit. Alternatively, the RF power amplifier pallet may further comprise an input matching network arranged in between the input terminal of the RF power transistor and the input of the RF amplifying unit and/or an output matching network arranged in between the output terminal of the RF power transistor and the output of the RF amplifying unit. Such matching network could comprise a series inductance and a capacitance to ground although other matching topologies are not excluded.

Typically, the RF power amplifier package comprises a substrate, such as a metal flange, on which one or more semiconductor dies are mounted. One or more RF power transistors are arranged on the one or more semiconductor dies. For example, the package may comprise a pair of semiconductor dies, each die comprises a single RF power transistor. To combine or process signals coming from or going to the RF power transistor(s), the package may comprise passive circuitry such as power splitters, power combiners, impedance matching networks and the like.

The output signals from the RF power transistors may be combined into a single output signal appearing at a single output of the RF amplifying unit. Alternatively, the RF amplifying unit may comprise a plurality of inputs and/or a plurality of outputs, each output and/or each input being connected to a respective load pad or source pad formed on the first or second dielectric layer. The various load pads, output leads, source pads, and input leads may be configured as defined above. At least one load pad may be connected to a separate first line segment as defined above. In addition, the power combiner may be at least partially formed in the RF amplifying unit. Alternatively, all of the power combining is performed by circuitry on the first and second dielectric layers. This circuitry may comprise the first and/or second line segments.

The first line segment may be arranged on the first dielectric layer. In this case, the RF power amplifier pallet may further comprise a second plurality of vias arranged spaced apart from the first line segment and extending through the first dielectric layer. This second plurality of vias electrically connects the second line segment to the plurality of metal wall segments. Alternatively, the first line segment may be arranged on the second dielectric layer. In this case, the second line segment may be directly connected to plurality of metal wall segments.

The present invention is not limited to a single RF amplifying unit being arranged in a cavity. For example, a further amplifying unit may be arranged in a further cavity that extends through the first and second dielectric layers. The RF power amplifier pallet may then further comprise a further coupler comprising a third line segment arranged on one of the first dielectric layer and the second dielectric layer, and a fourth line segment arranged on the other of the first dielectric layer and the second dielectric layer, wherein the third line segment is electrically connected to an output of the further RF amplifying unit, and wherein the third and fourth line segments are electromagnetically coupled. Furthermore, the RF power amplifier pallet may comprise a combiner for combining signals from the RF amplifying unit and the further RF amplifying unit, wherein the combiner has a first input connected to the second line segment, a second input connected to the fourth line segment, and a combining node connected to the plurality of metal wall segments. In such an embodiment, the second line segment and the fourth line segment are not directly coupled to the plurality of metal wall segments but via the combiner.

The invention is not limited to a particular semiconductor technology. However, the present invention is advantageously applied using a RF power transistor comprising a GaN-based field-effect transistor or a Si-based LDMOS transistor. Additionally or alternatively, GaAs, SiC and pure diamond based technologies may be used.

The RF power amplifier pallet may further comprise a waveguide output formed by a slot arranged in one or more of said wall segments. Through this slot, electromagnetic energy may be outputted. Alternatively, a waveguide output may be provided formed at an end of the dielectric filled waveguide.

The invention further provides a solid state cooking apparatus comprising a cooking cavity and the RF power amplifier pallet as described above, wherein the waveguide output is coupled to the cooking cavity.

The invention also provides a transmitter comprising the RF power amplifier pallet as defined above. This transmitter may for example be arranged in a base station for mobile telecommunications.

BRIEF DESCRIPTION OF THE DRAWINGS

Next, the invention will be described in more detail referring to the appended drawings, wherein.

DETAILED DESCRIPTION

Figure 3:
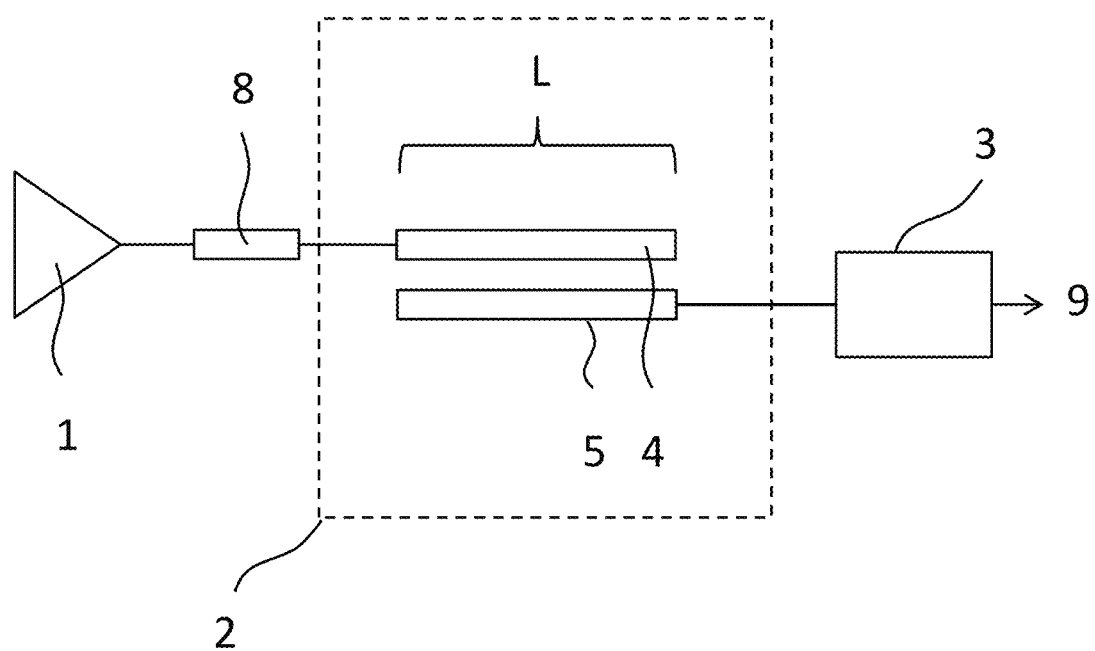
FIG. 3 illustrates the general concept of the present invention.

FIG. 3 illustrates the general concept of the present invention. Here, the RF power amplifier pallet comprises an RF amplifying unit 1, a coupled line coupler 2, and a dielectric filled waveguide 3. Coupler 2 comprises a first line segment 4 of which one end is connected, via an electrical delay 8, to an output of amplifying unit 1. Electrical delay 8 may comprise a transmission line, bondwires, and the like. In some embodiments, electrical delay 8 may be omitted or neglected.

Coupler 2 further comprises a second line segment 5 that is electromagnetically coupled to first line segment 4 over a length L. A first end of second line segment 5 is connected to dielectric filled waveguide 3. This waveguide comprises a plurality of metal wall segments to which a first end of second line segment 5 is connected. According to the invention, an end section of the dielectric layers on which first line segment 4, second line segment 5, and amplifying unit 1, are arranged and supported are provided with a plurality of metal wall segments. Furthermore, dielectric filled waveguide 3 is provided with an output 9 through which RF energy can leave the RF power amplifier pallet.

To optimally deliver RF energy, the impedance presented at the output of RF amplifying unit 1, and more in particular at the output of the RF power transistor that it accommodates, should have a particular value determined during the design stage. Typically, this value corresponds to the average or optimal use scenario of the RF power amplifier pallet. For example, the pallet can be designed in such a way that it delivers the maximum amount of energy into a cooking cavity of a solid state cooking apparatus if this cavity is partially loaded or if it is fully loaded with a predefined material. Moreover, the RF power amplifier pallet may use an amplifying unit that is designed to output maximum power when it is presented with a given impedance at its output. In such a case, the coupler, and optionally electrical delay 8, should be designed such that these impedance requirements are matched.

To meet the different impedance requirements, coupler 2 can be appropriately designed. For example, the separation between first line segment 4 and second line segment 5, and the widths and lengths of these lines can be varied in addition to the distance between these line segments and the one or more ground planes.

The skilled person is aware of various techniques by which such design can be realized. For example, in the paper "Coupled Transmission Lines as Impedance Transformer", by Thomas Jensen, published in IEEE Transactions on Microwave Theory and Techniques (Volume: 55, Issue: 12, December 2007), the authors describe design equations by which a particular impedance transformation ratio can be achieved.

Next, different practical implementations of the concept of FIG. 3 will be discussed.

Figure 1A:
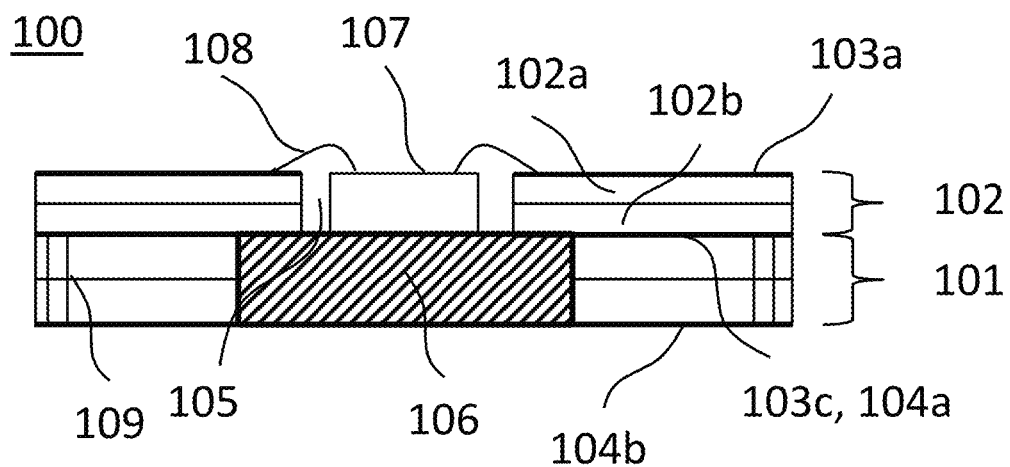
FIGS. 1A and 1B present a cross-sectional view and a top view of a first example of a known RF power amplifier pallet, respectively.
Figure 1B:
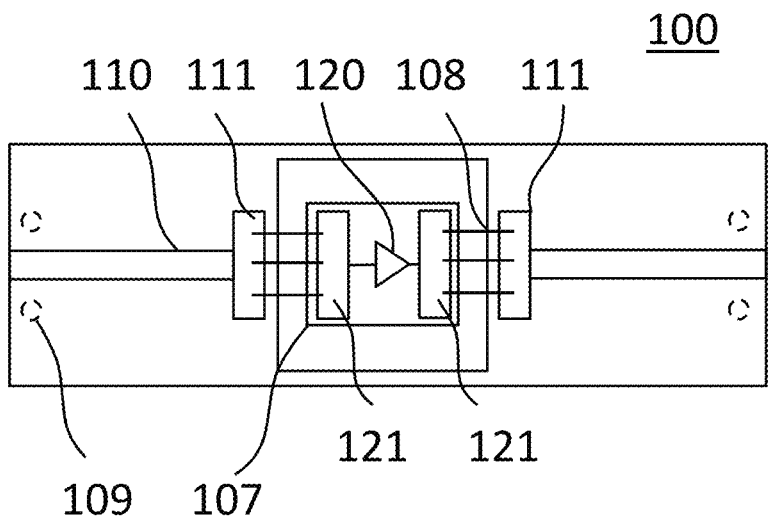
Figure 4A:
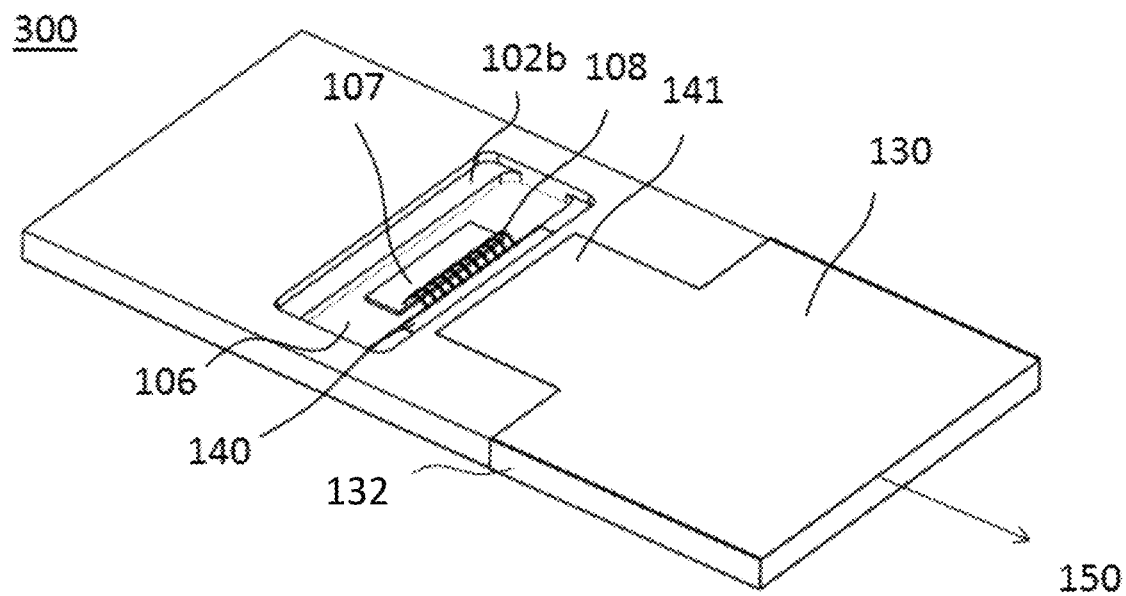
FIGS. 4A and 4B illustrate a first implementation of the concept of FIG. 3.

FIG. 4A illustrates an embodiment of the invention that resembles the example shown in FIG. 1A. However, contrary to the embodiment shown in FIG. 1A, an additional recess is visible in first dielectric layer 102a thereby exposing second dielectric layer 102b. On the exposed portion of second dielectric layer 102b, bondpads 111 are arranged for receiving bondwires that make the electrical connection to the bondpads on die 107. In addition, contrary to the embodiment in FIG. 1A, there is no DC connection between the output of the pallet and the output terminal of the RF amplifying unit. Consequently, whereas in the prior art, DC blocking capacitors are required to prevent a DC signal to emerge at the output of the pallet, the present invention inherently has no such component at its output.

FIG. 4A only illustrates a bondpad on the output side. More in particular, FIG. 4A illustrates a first line segment 140 that is realized in second metal layer 103b. Bondpads 111 are integrally connected to first line segment 140 and allow a connection using bondwires 108 to die 107. It should be noted that a bondpad may equally be realized on the input side. Such a bondpad could also be realized in second metal layer 103b.

Figure 4B:
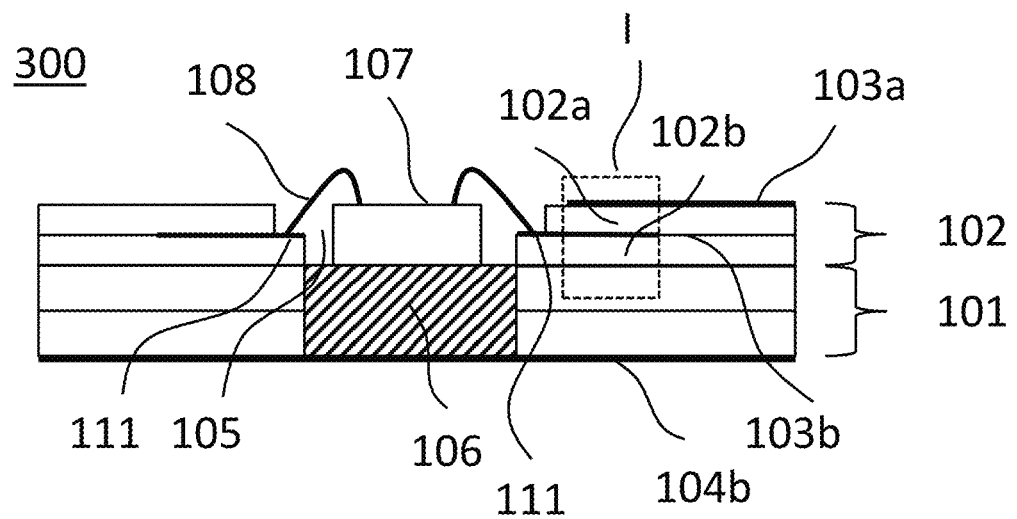

In addition to the abovementioned additional recess, the FIG. 4A embodiment differs from the example in FIG. 1A in that it further comprises a coupled line coupler and a dielectric filled waveguide. The coupled line coupler comprises the aforementioned first line segment 140 and a second line segment 141 that is realized in first metal layer 103a. In a region denoted by "I" in FIG. 4B, first line segment 140 and second line segment 141 form a pair of electromagnetically coupled lines.

Second line segment 141 is connected, in an integral manner, to a plurality of metal wall segments 130. Here, the plurality of metal wall segments 130 is formed by first metal layer 103a, metal layer 104b, and by a metal layer covering both side surfaces 132 of pallet 300. Consequently, the plurality of metal wall segments encloses first and second dielectric substrates 101, 102, and forms a dielectric-filled waveguide which is fed by second line segment 141. By keeping the end of the waveguide open, i.e. not covering it with a conductive material, a waveguide output can be formed as indicated by arrow 150. Such waveguide output can for instance be used to transmit electromagnetic energy in a cooking cavity of a solid state cooking apparatus. Alternatively, the waveguide output functions as a general antenna for telecommunications.

Some electrical length exists between the input of the coupler, i.e. the first end of first line segment 140, see FIG. 3, and bondpads 111. Further, even more electrical length exists between bondpads 111 and the output terminal of the RF power transistor that is arranged on semiconductor die 107. As discussed in conjunction with FIG. 3, various properties of the coupler can be designed such that optimal performance can be achieved. Additionally or alternatively, properties of the RF power transistor itself and/or the circuitry by which it is connected to first line segment 140 can be tuned or designed such that a suitable impedance transformation is achieved between the output of the RF power transistor and the input of the coupler.

In an embodiment, first dielectric substrate 101 has a dielectric permittivity in a range between 1 and 15 a thickness between 0.05 and 5 mm. Second dielectric substrate 102 has a dielectric permittivity in a range between 1 and 15 a thickness between 0.05 and 5 mm.

The frequency of interest may lie in a range between 0.4 and 100 GHz. Length L may vary between 150 and 0.5 millimeter, and the width of first line segment 140 and second line segment 141 may lie in a range between 150 and 0.5 millimeter.

Figure 2A:
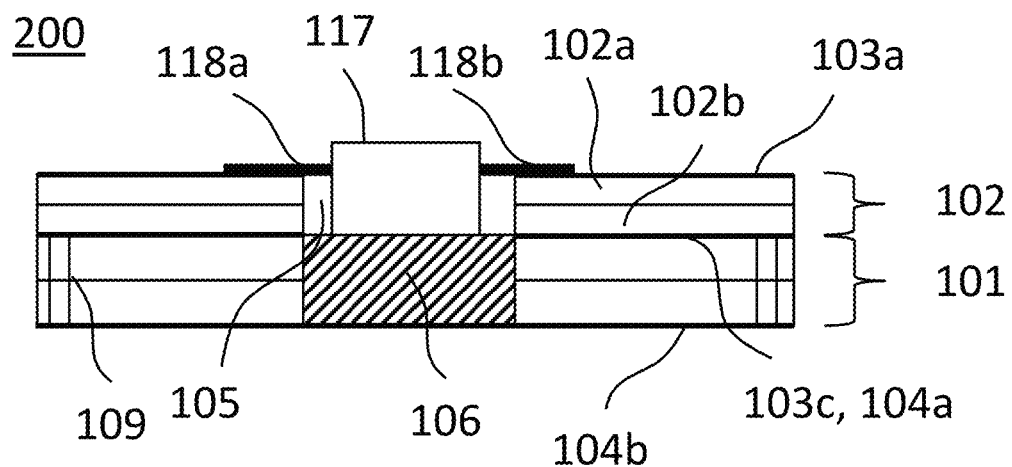
FIGS. 2A and 2B present a cross-sectional view and a top view of a second example of a known RF power amplifier pallet, respectively.
Figure 2B:
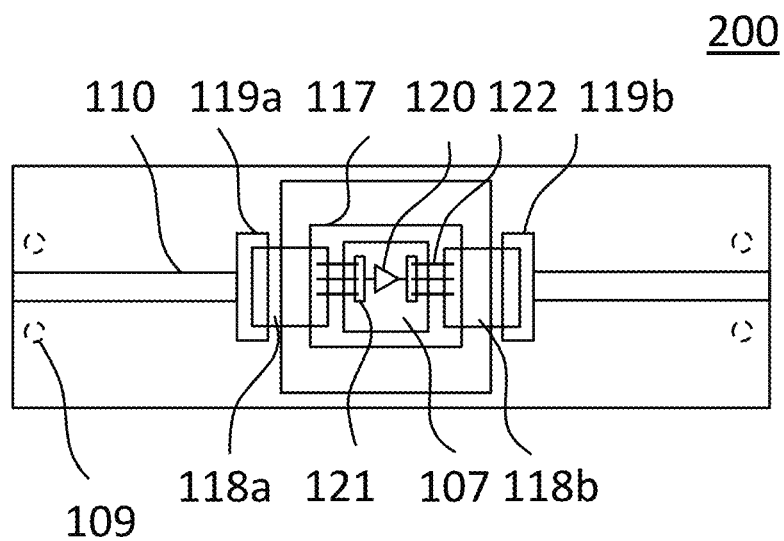
Figure 5A:
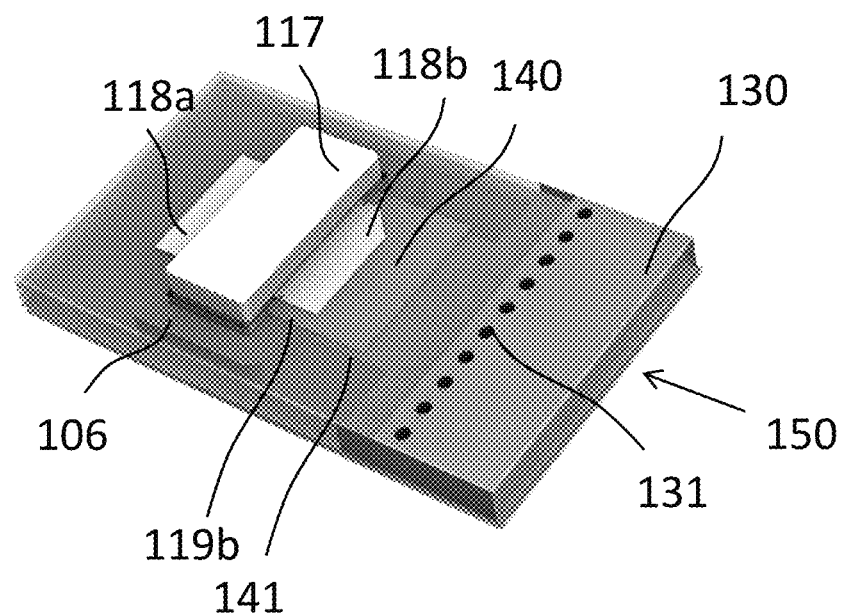
FIGS. 5A and 5B illustrate a second implementation of the concept of FIG. 3.
Figure 5B:
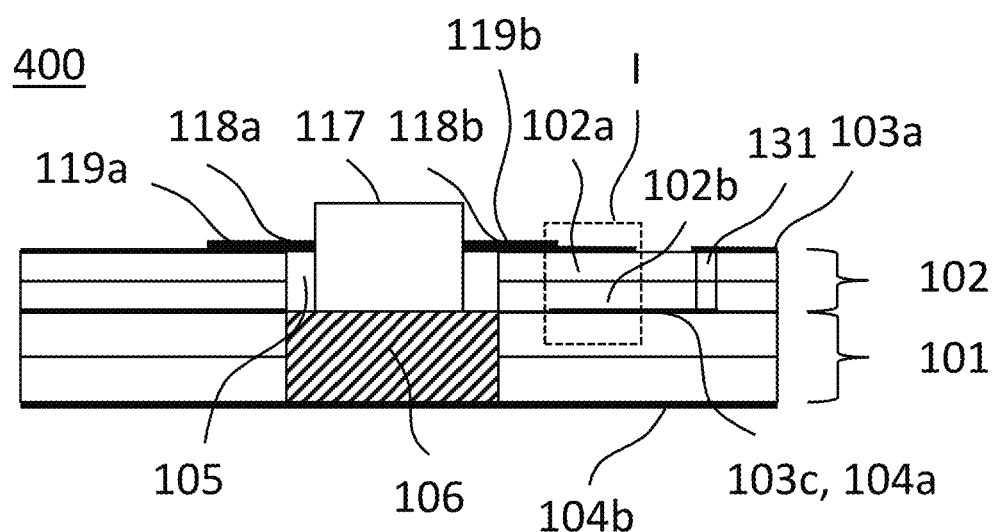

FIG. 5A illustrates an embodiment of the invention that resembles the example shown in FIG. 2A. This embodiment deviates from the embodiment in FIG. 4A in that this embodiment comprises an RF power amplifier package 117 having one or more input leads 118a and one or more output leads 118b. The description that will follow is limited to one input lead 118a and one output lead 118b but the skilled person will readily understand that the invention is not limited thereto. Similar to the FIG. 4A embodiment, only the connections at the output will be shown and "I" in FIG. 5B denotes the region where first line segment 140 and second line segment 141 form a pair of electromagnetically coupled lines.

Contrary to the FIG. 4A embodiment, there is no additional recess and output lead 118b connects to a lead receiving pad 119b that is integrally formed with first line segment 140. Moreover, first line segment 140 is now formed using first metal layer 103a and second line segment 141 is formed using second metal layer 103b. Consequently, to connect the first end of second line segment 141 to metal wall segments 130 a plurality of vias 131 is used to make the connection to the part of the metal wall segments that is realized using first metal layer 103a. However, vias may also be used that connect to the part of metal wall segments 130 that is realized using metal layer 104b.

Although the embodiment in FIG. 4A requires an additional recess, it does not require vias 131 as second line segment 141 is already realized in first metal layer 103a.

The skilled person will readily understand that RF power amplifier package 117 could equally be arranged in a manner similar to FIG. 4A, i.e. using an additional recess and a connection of output lead 118b to a lead receiving pad realized in second metal layer 103b. On the other hand, semiconductor die 107 can equally be arranged in a manner similar to FIG. 5A, i.e. using bondwire connections that connect to bondpads realized in first metal layer 103a.

Figure 6A:
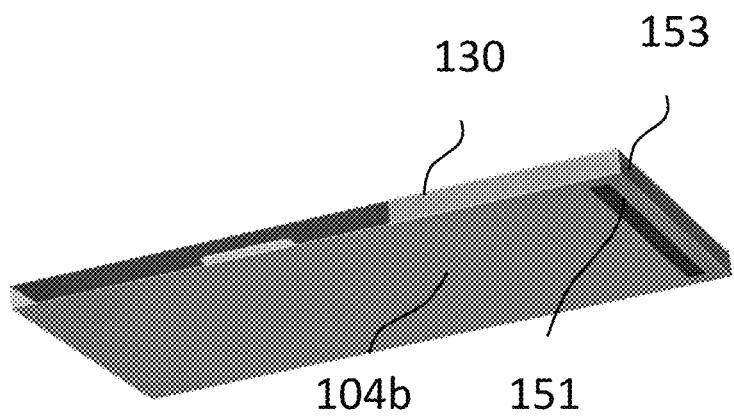
FIGS. 6A and 6B depict an embodiment of the invention showing a slot antenna that can be applied to the first and second implementations.
Figure 6B:
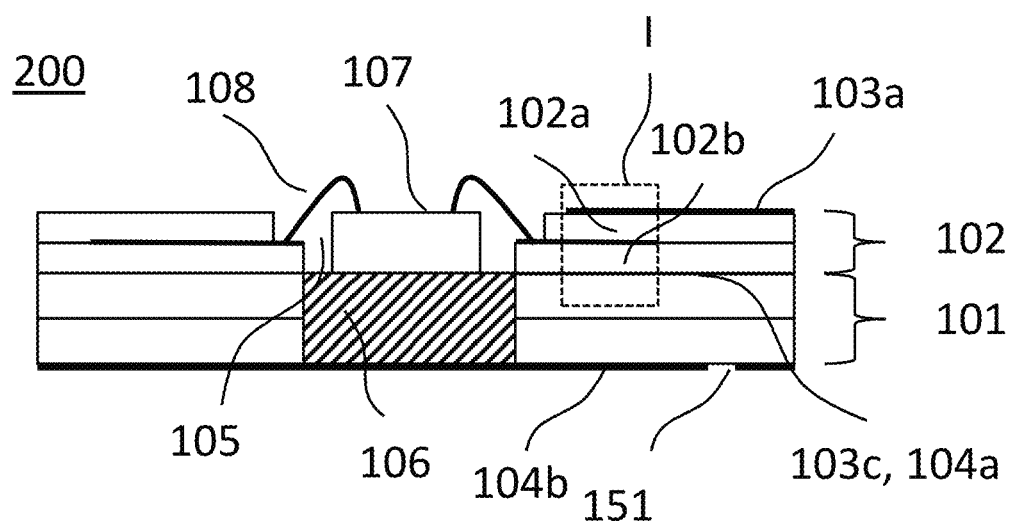

FIGS. 6A and 6B show an embodiment similar to the embodiment of FIG. 4A with the exception that the end of the waveguide, denoted by 153, is covered by metal. In addition, a slot 151 is formed in metal layer 104b. In this embodiment, electromagnetic radiation will leave the waveguide through slot 151. Such slot may be coupled to a cooking cavity of a solid state cooking apparatus. For example, the cooking cavity may comprise a metal wall having an opening that is aligned with slot 151. In such configuration, the RF power amplifier pallet is completely arranged outside the cooking cavity and RF energy is introduced via slot 151 and the opening in the metal wall of the cooking cavity with which it is aligned. A similar configuration can be achieved with waveguide output 150 shown in FIGS. 4A and 5A. Alternatively, RF power amplifier pallet extends partially in the cooking cavity such that waveguide output 150, 151 is located inside the cooking cavity.

Figure 7A:
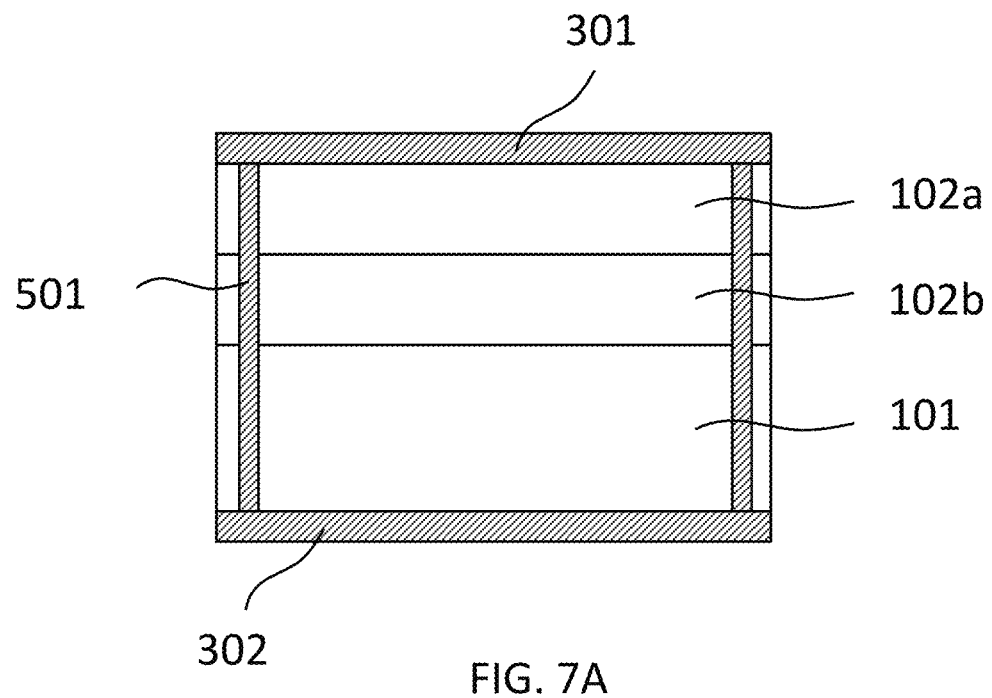
FIGS. 7A and 7B depict two alternative configurations for realizing a dielectric filled waveguide in accordance with the invention.
Figure 7B:
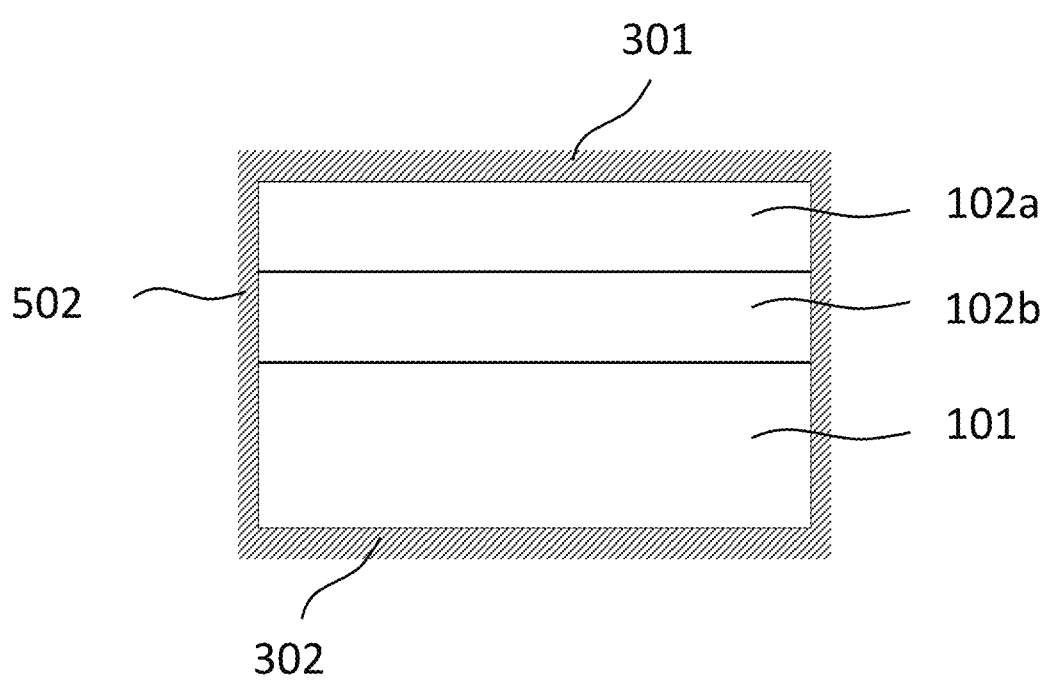

FIGS. 7A and 7B depict two alternative configurations for realizing a dielectric filled waveguide in accordance with the invention. In the FIG. 7A embodiment, the plurality of wall segments comprises an upper wall segment 301 covering a top surface of first dielectric layer 102a and a lower wall segment 302 covering a bottom surface of first dielectric substrate 101. These walls may be realized using metal layers 103a and 104b, respectively. A plurality of vias 501 connect upper wall segment 301 to lower wall segment 302. These vias are adjacently arranged in the longitudinal direction of the pallet to form a wall of vias.

In the FIG. 7B arrangement, the vias have been replaced by side wall segments 502 that cover a side surface of first dielectric substrate 101 and second dielectric substrate 102. These side wall segments electrically connect upper wall segments 301 and lower wall segments 302.

Although the present invention has been explained using detailed embodiments thereof, the skilled person will understand that the invention is not limited to these embodiments and that various modifications to these embodiments are possible without deviating from the scope of the present invention which is defined by the appended claims. For example, the RF power amplifier pallet could be used as transmitter devices in telecommunications applications. This particularly holds for the embodiments in which a slot is arranged in the dielectric filled waveguide. Such embodiments may be used in antenna systems of base stations for mobile telecommunications.

The invention claimed is:

1. A radiofrequency radio frequency (RF) power amplifier pallet, comprising:
    a first dielectric substrate;
    a second dielectric substrate, arranged on the first dielectric substrate and comprising a first dielectric layer and a second dielectric layer, the second dielectric substrate comprising a cavity extending through the first and second dielectric layers; and
    a RF amplifying unit comprising a RF power transistor, and being arranged in the cavity, the RF amplifying unit comprising an input and an output;
    and wherein the RF power amplifier pallet further comprises:
    a coupled line coupler comprising a first line segment and a second line segment that is electromagnetically coupled to the first line segment, wherein a first end of the first line segment is electrically connected to the output of the RF amplifying unit; and
    a dielectric filled waveguide comprising an end section of the first dielectric substrate, an end section of the second dielectric substrate, and a plurality of electrically connected metal wall segments covering the end sections of the first and second dielectric layers, the plurality of electrically connected metal wall segments being arranged spaced apart from the first line segment and being electrically connected to a first end of the second line segment.

2. The RF power amplifier pallet according to claim 1, wherein the plurality of electrically connected metal wall segments comprises an upper wall segment covering a top surface of the first dielectric layer and a lower wall segment covering a bottom surface of the first dielectric substrate,
and wherein the upper wall segment is connected to the lower wall segment by at least one of a first plurality of via, or one or more side wall segments that cover a side surface of the first and second dielectric substrate and electrically connect the upper and lower wall segments.

3. The RF power amplifier pallet according to claim 1, wherein a second end of the first line segment and a second end of the second line segment are connected to an electrical open.

4. The RF power amplifier pallet according to claim 1, wherein the coupler is configured to convert a low output impedance at the output of the amplifying unit to a higher impedance.

5. The RF power amplifier pallet according to claim 4, wherein an electrical length between the second end of the first line segment and one of the output terminal of the RF power transistor, the output of the RF amplifying unit, or the first end of the first line segment substantially equals (2n+1) times 90 degrees, wherein n is an integer number equal to 0 or larger.

6. The RF power amplifier pallet according to claim 1, wherein the first line segment is arranged on one of the first dielectric layer or the second dielectric layer, and wherein the second line segment is arranged on the other of the first dielectric layer or the second dielectric layer.

7. The RF power amplifier pallet according to claim 6, further comprising:
a source pad and a load pad arranged on one of the first dielectric layer or the second dielectric layer,
wherein the source pad is electrically connected to the input of the RF amplifying unit and wherein the load pad is electrically connected to the output of the RF amplifying unit and to the first line segment.

8. The RF power amplifier pallet according to claim 7, wherein the source and load pads are arranged on the second dielectric layer, and wherein the second dielectric substrate further comprises a recess of the first dielectric layer in proximity to the cavity and exposing the source and load pads.

9. The RF power amplifier pallet according to claim 7, wherein the RF amplifying unit comprises a RF power amplifier package in which the RF power transistor is accommodated, the RF power amplifier package comprising an input lead forming the input of the RF amplifying unit and being connected to an input terminal of the RF power transistor and comprising an output lead forming the output of the RF amplifying unit and being connected to an output terminal of the RF power transistor, wherein the input lead and output lead are physically connected to the source pad and load pad, respectively.

10. The RF power amplifier pallet according to claim 9, further comprising a matching network, wherein the matching network is at least one of: (i) an input matching network arranged in between the input terminal of the RF power transistor and the input of the RF amplifying unit, or (ii) an output network arranged in between the output terminal of the RF power transistor and the output of the RF amplifying unit.

11. The RF power amplifier pallet according to claim 7, wherein the RF amplifying unit comprises a semiconductor die on which the RF power transistor is arranged, the semiconductor die comprising an input bond pad or bar forming the input of the amplifying unit and being connected to an input terminal of the RF power transistor, and an output bond pad or bar forming the output of the RF amplifying unit and being connected to an output terminal of the RF power transistor, wherein the input and output bond pads or bars are electrically connected to the source pad and load pad, respectively.

12. The RF power amplifier pallet according to claim 11, further comprising a matching network, wherein the matching network is at least one of: (i) an input matching network arranged in between the input terminal of the RF power transistor and the input of the RF amplifying unit, or (ii) an output network arranged in between the output terminal of the RF power transistor and the output of the RF amplifying unit.

13. The RF power amplifier pallet according to claim 1, wherein the first line segment is arranged on the first dielectric layer, the RF power amplifier pallet further comprising a second plurality of vias arranged spaced apart from the first line segment and extending through the first dielectric layer, the second plurality of vias electrically connecting the second line segment to the plurality of electrically connected metal wall segments.

14. The RF power amplifier pallet according to claim 1, wherein the first line segment is arranged on the second dielectric layer and wherein the second line segment is directly connected to the plurality of electrically connected metal wall segments.

15. The RF power amplifier pallet according to claim 1, wherein the RF power transistor is one of a GaN-based field-effect transistor or a Si-based LDMOS transistor.

16. The RF power amplifier pallet according to claim 1, further comprising a waveguide output, where in the waveguide output is formed: (i) by a slot arranged in one of more of the electrically connected metal wall segments, or (ii) at an end of the dielectric filled waveguide.

17. A solid state cooking apparatus comprising:
a cooking cavity; and
radiofrequency radio frequency (RF) power amplifier pallet, comprising:
a first dielectric substrate;
a second dielectric substrate, arranged on the first dielectric substrate and comprising a first dielectric layer and a second dielectric layer, the second dielectric substrate comprising a cavity extending through the first and second dielectric layers; and
a RF amplifying unit comprising a RF power transistor, and being arranged in the cavity, the RF amplifying unit comprising an input and an output;
and wherein the RF power amplifier pallet further comprises:
a coupled line coupler comprising a first line segment and a second line segment that is electromagnetically coupled to the first line segment, wherein a first end of the first line segment is electrically connected to the output of the RF amplifying unit;
a dielectric filled waveguide comprising an end section of the first dielectric substrate, an end section of the second dielectric substrate, and a plurality of electrically connected metal wall segments covering the end sections of the first and second dielectric layers, the plurality of electrically connected metal wall segments being arranged spaced apart from the first line segment and being electrically connected to a first end of the second line segment; and a waveguide output, where in the waveguide output is formed: (i) by a slot arranged in one of more of the plurality of electrically connected metal wall segments, or (ii) at an end of the dielectric filled waveguide, and wherein the waveguide output is coupled to the cooking cavity.

18. A transmitter arranged in a base station for mobile telecommunications, the transmitter comprising a radio frequency (RF) power amplifier pallet, wherein the RF power amplifier pallet comprises:

a first dielectric substrate;

a second dielectric substrate, arranged on the first dielectric substrate and comprising a first dielectric layer and a second dielectric layer, the second dielectric substrate comprising a cavity extending through the first and second dielectric layers; and a RF amplifying unit comprising a RF power transistor, and being arranged in the cavity, the RF amplifying unit comprising an input and an output;

and wherein the RF power amplifier pallet further comprises:

a coupled line coupler comprising a first line segment and a second line segment that is electromagnetically coupled to the first line segment, wherein a first end of the first line segment is electrically connected to the output of the RF amplifying unit; and a dielectric filled waveguide comprising an end section of the first dielectric substrate, an end section of the second dielectric substrate, and a plurality of electrically connected metal wall segments covering the end sections of the first and second dielectric layers, the plurality of electrically connected metal wall segments being arranged spaced apart from the first line segment and being electrically connected to a first end of the second line segment.

* * * * *